United States Patent [19]

Chambers et al.

[11] 4,150,989
[45] Apr. 24, 1979

[54] PHOTOSENSITIVE ARTICLE HAVING POLYALDEHYDES AND ITS USE IN PHOTOIMAGING

[75] Inventors: William J. Chambers, Wilmington; Robert P. Foss, Hockessin, both of Del.

[73] Assignee: E. I. Du Pont de Nemours and Company, Wilmington, Del.

[21] Appl. No.: 841,827

[22] Filed: Oct. 6, 1977

Related U.S. Application Data

[62] Division of Ser. No. 760,935, Jan. 21, 1977, Pat. No. 4,108,839.

[51] Int. Cl.$^2$ .................. G03C 5/00; G03C 1/68; G03C 1/78
[52] U.S. Cl. .................. 96/35.1; 96/87 R; 96/115 R
[58] Field of Search .................. 96/35.1, 115 R, 87 R

[56] References Cited

U.S. PATENT DOCUMENTS

| | | | |
|---|---|---|---|
| 3,849,137 | 11/1974 | Barzynski et al. | 96/67 |
| 3,913,514 | 12/1975 | Marsh | 96/35 |
| 3,915,704 | 10/1975 | Limburg et al. | 96/27 R |
| 3,984,378 | 10/1976 | Kabota et al. | 260/67 A |
| 3,991,033 | 11/1976 | Sam | 260/67 FP |

*Primary Examiner*—Jack P. Brammer

[57] ABSTRACT

Photosensitive polyaldehydes are provided which have the formula:

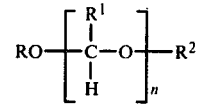

wherein
R is a photosensitive end group selected from (a) 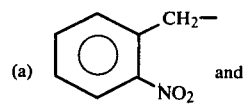 and (b)

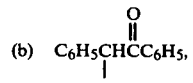

$R^1$ is H or n-alkyl of 1–5 carbon atoms, preferably H,
$R^2$ is (a) n-alkanoyl of 1–4 carbon atoms or (b) n-alkanoyl of 1–4 carbon atoms or

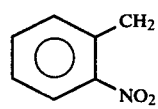

when $R^1$ is H, and
n is a positive integer of about 10–4000.

The polyaldehydes are prepared by the anionic polymerization of the appropriate aldehyde with an initiating amount of an alkali metal or tetraalkylammonium alkoxide of RO in the above formula.

The polyaldehydes are useful in articles and methods of relief imaging and in lithographic plates.

13 Claims, No Drawings

PHOTOSENSITIVE ARTICLE HAVING POLYALDEHYDES AND ITS USE IN PHOTOIMAGING

CROSS-REFERENCE TO RELATED APPLICATION

This is a division of application Ser. No. 760,935, filed Jan. 21, 1977, now U.S. Pat. No. 4,108,839.

BACKGROUND OF THE INVENTION

1. Field of the Invention

This invention relates to polyaldehydes, particularly polyoxymethylene polymers, containing photochemically degradable end groups and to articles and methods of relief imaging using the same.

2. Relation to the Prior Art

In U.S. Pat. No. 3,991,033 issued Nov. 9, 1976, to Sam, random copolymers containing polyoxymethylene chains with interspersed photosensitive units, wherein both ends are joined to oxygen, are described. The units have the formula

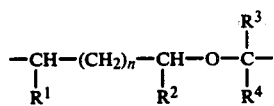

wherein $R^1$ and $R^2$ are H or phenyl optionally substituted with up to 5 substituents of lower alkyl, preferably methyl, or —$NO_2$, n is 0 or 1, $R^3$ and $R^4$ are H or lower alkyl, preferably H or methyl, with the provisos (i) that at least one of $R^1$ and $R^2$ is a phenyl group having at least one orthonitro substituent, (ii) that when n is 1, $R^1$ and $R^2$ are o-nitrophenyl or H and o-nitrophenyl, said photosensitive linking units being present in an amount of from 0.001 to 0.05, preferably 0.002 to 0.01 unit per —$CH_2O$— unit, said polymers having a number average molecular weight of from 1000 to 100,000, and preferably having an inherent viscosity of 0.7 to 1.5 measured in hexafluoroisopropanol (HFIP) in 0.5% concentration at 30° C., which corresponds to a number average molecular weight for polymers of this type of about 15,000 to about 40,000.

The polymers of that invention are made by intercalation of preformed polyoxymethylene polymers with substituted dioxolanes, where n=0, and with substituted dioxanes, where n=1, of the formulae:

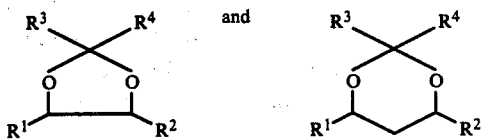

In these formulae $R^1$, $R^2$, $R^3$ and $R^4$ are as defined above. Dioxolanes are more readily obtained and are preferred.

Although the polymers of that invention may contain a photosensitive unit at the end of a polymer chain, they also contain photosensitive units randomly interspersed within the polymer chains because of their method of preparation by intercalation. In contrast with the prior art polymers, the polymers of the present invention contain photosensitive units only at the ends of the polymer chains because of their method of preparation.

Barzynski, et. al. U.S. Pat. Nos. 3,849,137 and 3,926,636, disclose light-curable compositions having a photosensitive polymer working layer containing o-nitrocarbinol ester groups.

Limburg, et. al. U.S. Pat. Nos. 3,915,704, 3,915,706, and 3,917,483, disclosed imaging compositions and methods based upon photoinduced degradation of a polyaldehyde catalyzed by an acid, generated photochemically from a potential or latent acid. The polyaldehydes do not contain photosensitive units.

Marsh, U.S. Pat. No. 3,923,514, discloses a process for the preparation of relief printing masters which uses a degradable polyaldehyde or polyketone and a photooxidant which is capable of abstracting an electron from an oxygen atom of the polymer. The polyaldehydes and polyketones do not contain photosensitive units.

SUMMARY OF THE INVENTION

According to the present invention there is provided a photosensitive polyaldehyde having the formula

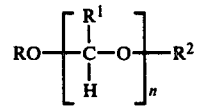

wherein
R is a photosensitive end group selected from

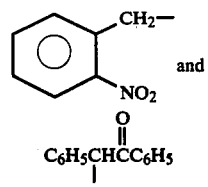 (a)

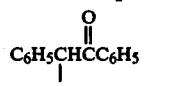 (b)

$R^1$ is H or n-alkyl of 1-5 carbon atoms, $R^2$ is (a) n-alkanoyl of 1-4 carbon atoms or (b) n-alkanoyl of 1-4 carbon atoms or

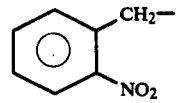

when $R^1$ is H, and n is a positive integer of about 10–4000.

There is also provided an imagable article comprising a substrate having on its surface a film of a composition comprising a blend of the aforesaid photosensitive polyaldehyde with a polymer capable of being cross-linked with aldehyde thermally released from the polyaldehyde.

Also provided is a process for the formation of images comprising: (1) imagewise exposing the aforesaid article to radiation of wavelength in the range of about 2,000Å–8,000Å for a time sufficient to effect substantial rearrangement of the photosensitive end groups of the polyaldehyde; (2) heating the exposed article at a temperature and for a time sufficient to effect cleavage of the rearranged end groups, to release aldehyde monomer from the polyaldehyde, and to effect crosslinking of the polymer with the released aldehyde and (3) removing non-crosslinked polymer from the areas not exposed to radiation.

DETAILED DESCRIPTION OF THE INVENTION

The present invention provides polyaldehyde polymers containing photosensitive, but thermally stabilizing, end groups. It is well-known that polyaldehydes degrade thermally and under the influence of base by chain unzippering to give the parent aldehyde. Stabilization of such polymers can be achieved by end-capping free hydroxyl groups with ether or ester groups which prevent the initiation of chain unzippering.

The polyaldehydes of the invention have the formula:

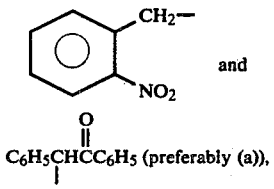

wherein R is a photosensitive end group selected from

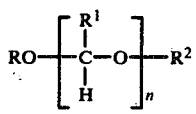

and $$C_6H_5CHCC_6H_5 \text{ (preferably (a))},$$

$R^1$ is H or n-alkyl of 1-5 carbon atoms, preferably H, $R^2$ is (a) n-alkanoyl of 1-4 carbon atoms, (preferably acetyl) or (b) n-alkanoyl of 1-4 carbon atoms (preferably acetyl) or

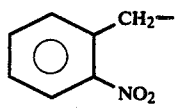

when $R^1$ is H, and n is a positive integer of about 10-4000, preferably about 15-300.

The polymers of the present invention contain a high proportion of photosensitive end groups which confer thermal stability and they are of the structural type A or B:

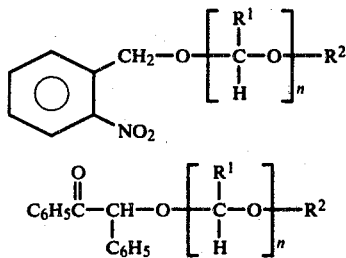

The mechanism of the photolytic and thermal degradation of polymers A and B is not known for certain, but it is believed to occur as depicted in equations (1) and (2) respectively.

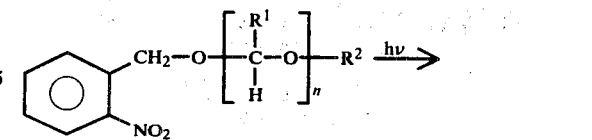

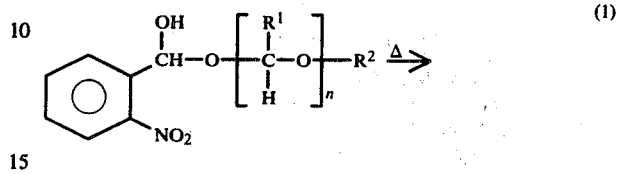

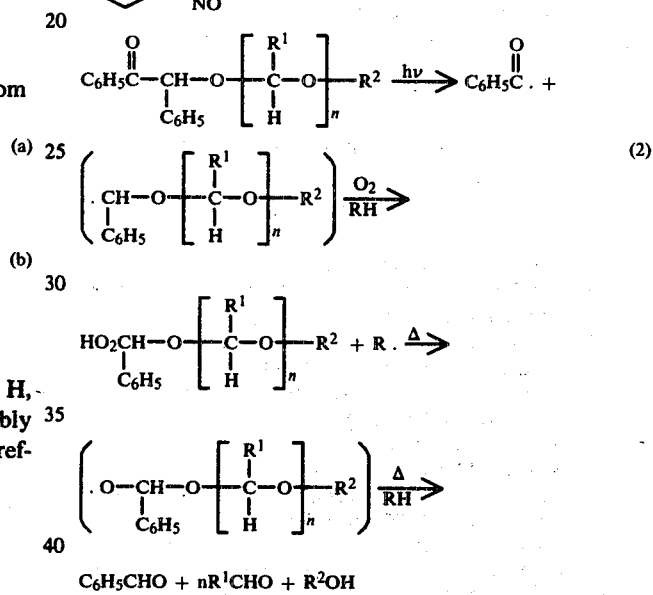

Since the photo-labile groups are located only on the ends of the polymer chains, essentially complete thermal degradation of the polyaldehydes can occur once the unzippering process begins. This is in contrast with the polymers of the aforesaid U.S. Pat. No. 3,991,033, which contain photolabile groups intercalated within the polyaldehyde chain as well as at the chain ends. The mechanism of the photolytic and thermal degradation of these polymers is believed to occur as depicted in equation (3).

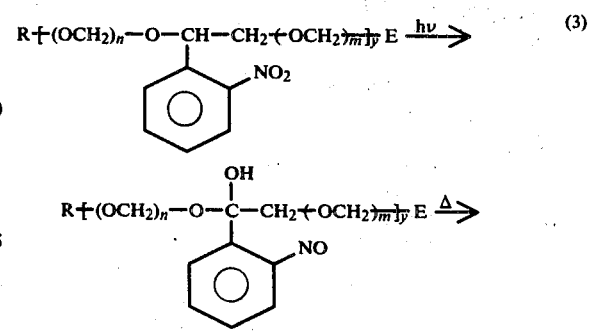

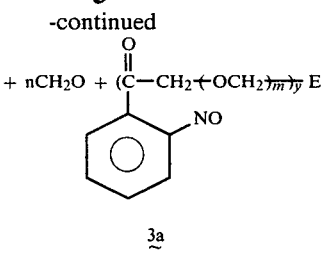

Residual unzippered fragments such as 3a may remain when chain-end E is a non-labile fragment such as acetate. Hence photothermal degradation of the polymers may be incomplete and relatively uncontrolled since the intercalation process incorporates photolabile groups randomly within the polyaldehyde chains.

The polymers of the present invention are preferably prepared by anionic polymerization of a suitable aldehyde using an alkali metal salt of the photolabile end group as initiator. Any straight chain aldehyde (alkanal) containing up to six carbon atoms can be employed, i.e., formaldehyde, acetaldehyde, propionaldehyde, n-butyraldehyde, n-valeraldehyde and n-hexaldehyde. Formaldehyde is preferred, because of its ease of anionic polymerization, the stability of its polymers, and because the photo-thermally released monomer reacts rapidly with the cross-linkable polymer component in photoimaging applications.

Anionic polymerization of aldehydes is known as discussed by O. Vogl in his book "Polyaldehydes", Edward Arnold Ltd., London, 1967, pp. 52–66. Relatively strong bases are required to initiate polymerization, for example, alkali metal alkoxides, soluble hydrides, organometal compounds such as butyllithium, and Grignard compounds. When a photolabile group is employed as an initiator, it is incorporated as an end group into the polymer chain. It is preferred to use photolabile alkoxides as polymerization initiators, and the photolabile group is incorporated as an ether end group. Suitable alkoxide initiator counter ions include the alkali metal cations, (lithium, sodium and potassium) as well as tetraalkylammonium wherein each alkyl group, alike or different, is from 1-6 carbon atoms, such as tetrabutylammonium. It is preferred to employ about 0.00025–0.1 mole of alkoxide initiator per mole of aldehyde charged to obtain polyaldehydes with the desired degree of polymerization. To improve initiator solubility in certain hydrocarbon solvents, it is desirable to add a tertiary amine complexing agent to complex with the alkali metal cation. Preferred as a complexing agent is N,N,N'N'-tetramethylethylenediamine.

Solvents inert to the polymerization may be usefully employed. Such solvents include aromatic and aliphatic hydrocarbons, ethers, and hindered tertiary amines. Mixtures of solvents may also be usefully employed. For polymerization of $C_2$–$C_6$ aldehydes, relatively non-polar hydrocarbon solvents are preferred, i.e., those with a low dielectric constant, since higher yields of polymer are obtained. For polymerization of formaldehyde, the preferred solvents include tetrahydrofuran, cyclohexane, and hexane.

Aldehyde polymerization can be carried out within the temperature range of about −80° to about 100° C. depending upon the specific aldehyde employed, reaction solvent, desired degree of conversion to polymer, reaction pressure, etc. With $C_2$–$C_6$ carbon aldehydes, lower temperatures are usually employed, preferably below −50° C. With formaldehyde, temperatures as high as about 100° C. can be used, but preferably about −50° to about 30° C.

Aldehyde polymerization rates can be very fast, and polymerization is usually complete within about one hour. When formaldehyde is employed as the monomer, it is preferred to prepare anhydrous formaldehyde from paraformaldehyde in a separate generator, and pass the gaseous formaldehyde into a solution of the initiator. Usually an excess of the carbinol corresponding to the initiator, i.e., o-nitrobenzyl alcohol or benzoin, is added as a chain transfer agent during polymerization. This insures the incorporation of a photolabile end group into the majority of the polymer chains. It is preferred to employ at least about a 100% excess of the carbinol. The polymerization is terminated by addition of a proton source such as a carboxylic acid. Acetic acid is preferred as the proton source.

The intermediate polyaldehyde, which initially contains hydroxyl end groups, is encapped by conventional methods, such as using an anhydride of a carboxylic acid of 1-4 carbon atoms, preferably acetic anhydride, to provide polymer chains with terminal acetate end groups.

The polymers of the invention when R' is H can also be prepared by end capping the hydroxyl end groups of a polyaldehyde with tris(o-nitrobenzyl) orthoformate to attach o-nitrobenzyl end groups to the polymer chains. This endcapping reaction is preferably carried out with an acidic catalyst, preferably boron trifluoride etherate, in heptane solvent at a temperature of 70°–100° C. for a reaction time of 0.5–3 hours.

The polyaldehydes of the invention normally have a degree of polymerization, n, of about 10 to 4000, with 15 to 300 being preferred. The degree of polymerization is determined from melting point data obtained by differential thermal analysis (DTA). Melting point data obtained are compared with published data correlating the melting point with the degree of polymerization of polyoxymethylene diacetates and polyoxymethylene dimethyl ethers. Such reference data can be found, for example, in Tables 61 and 63, pages 164 and 168, of J. F. Walker's book, "Formaldehyde", 3rd edition, Reinhold Publishing Corporation, New York, 1964. Since the polyaldehydes of the invention have one ether and one ester end group, an average of the data in Tables 61 and 63 of the reference are used to determine the value of n.

The number of polyaldehyde chains capped with photolabile groups can be conveniently determined by quantitative infrared analysis. A comparison of the nitro group absorbtivity of the polyaldehyde at 6.5μ with the carbonyl stretching frequency (5.75μ) of the acetate end group using o-nitrobenzyl acetate as a reference compound gives the percent of polymer chains capped with an o-nitrobenzyl group. When the anion of benzoin is used as a photolabile initiator, infrared analysis of the polyaldehyde shows the presence of both acetate and benzoyl carbonyl stretching bands, the former at 5.78μ and the latter at 5.9μ. For an equimolar concentration, the ratio of acetate to benzoyl carbonyl stretching bands is 1.458.

The imaging process of this invention employs a suitable imagable article comprising a substrate having a radiation sensitive coating on one surface thereof. This article is formed by coating or impregnating a suitable substrate with a mixture of the photosensitive polyaldehyde of the invention and a polymer capable of being crosslinked with thermally released aldehyde following known techniques. By "substrate" is meant any natural or synthetic support which is capable of existing in film or sheet form and can be flexible or rigid. For example, the substrate could be a metal sheet or foil, a sheet or film of synthetic organic resin, cellulose paper, fiberboard, and the like, or a composite of two or more of these materials. Specific substrates include alumina-blasted aluminum, alumina-blasted polyester film, silicon wafers, polyester film, polyvinyl alcohol-coated paper, crosslinked polyester-coated paper, nylon, glass, heavy paper such as lithographic paper, and the like.

Preferred as crosslinkable polymers are polyamides because of their ease of reaction with the photothermally-released aldehyde to give tightly crosslinked polymers. However, other such polymers are the polyureas, polyurethanes, polyamines and the like. The amount of photosensitive polymer employed is not critical, but sufficient aldehyde should be present to effect crosslinking of the polyamide. Weight ratios of about 5-30% of polyaldehyde in the polyaldehyde/polyamide mixture are generally satisfactory.

When the polyaldehyde/polyamide compositions are coated on metal surfaces, they are useful for making lithographic printing plates. For example, use of a grained aluminum base in combination with a photolabile polymer mixture results in a developed lithographic plate. The plate, after radiation and image development, is first coated with an aqueous solution of Age (Pitman Co.) and is then contacted with a roller which wets only the photopolymer image with ink. The inked plate can then be used in lithographic printing in the usual way.

the photodegradable polyaldehyde/polyamide compositions may optionally contain other materials inert to the photodepolymerization reaction. Such materials include thermoplastic and nonthermoplastic binders useful for varying the physical properties of the resultant polymeric images. In addition, plasticizers may be added to lower the glass transition temperature and facilitate selective stripping. If desired, the polymers may also contain immiscible polymeric or nonpolymeric organic or inorganic fillers or reinforcing agents which are essentially transparent, e.g., the organophilic silicas, bentonites, silica, powdered glass, colloidal carbon, as well as various types of dyes and pigments. Ohter useful additives which may be employed include sensitizers to improve the efficiency of the radiation and, adhesion promoters.

The polyaldehyde/polyamide composition can be applied to the substrate as a solution or a dispersion in a carrier solvent, which may be sprayed, brushed, applied by a roller or an immersion coater, flowed over the surface, picked up by immersion or applied to the substrate by other means. The solvent is then allowed to evaporate. Useful solvents include those known in the art to dissolve polyaldehydes and polyamides, e.g., hexafluoroisopropanol, phenol and substituted phenols including the halophenols, nitrophenols and cresols, benzyl alcohol and other fluorinated alcohols such as $\alpha,\alpha$-di(trifluoromethyl)benzyl alcohol. Useful dispersion solvents include those known to dissolve polyamides including aliphatic alcohols such as butanol and methanol. Coating temperatures range from about 0°-180° C. depending upon the solvent employed. Alternatively, substrate coating may be achieved by hot-pressing a film of the polymers to the substrate or by melt-coating techniques. The coating thickness is not critical, but will generally be about 0.01-25 mils (0.000254-0.635 mm).

The photolabile polymer composition is exposed to radiation of wavelength in the 2000-8000Å range, preferably 2500-5000Å. Suitable sources of such radiation, in addition to sunlight, include carbon arcs, mercuryvapor arcs, fluorescent lamps with ultraviolet radiation-emitting phosphors, electronic flash units, and photographic flood lamps.

When artificial radiation sources are used, the distance between the photosensitive layer and the radiation source may be varied according to the radiation sensitivity of the polyaldehyde. Customarily, mercury-vapor arcs are used at a distance of 1.5 to 24 inches from the photosensitive layer.

Imagewise exposure, for example, in preparing printing plates, is conveniently carried out by exposing a layer of the photolabile polymer composition to radiation through a process transparency; that is, an image-bearing transparency consisting solely of areas substantially opaque and substantially transparent to the radiation being used where the opaque areas are substantially of the same optical density, for example, a so-called line of halftone negative or positive. Variable depth images may also be obtained by exposure through a continuous tone transparency. Process transparencies may be constructed of any suitable materials including cellulose acetate film and oriented polyester film.

The length of time for which the compositions are exposed to radiation may vary upwards from a few seconds. Exposure times will vary, in part, according to the nature of the polymer and the concentration and type of photolabile end group present, and the type of radiation. However, the exposure time must be sufficient to effect substantial rearrangement of the photosensitive end groups of the polyaldehyde.

Image development is accomplished by depolymerization of the unstable polymer chains formed in the irradiated areas of the polymer composition followed by crosslinking of the polyamide resin with the thermally released aldehyde. The depolymerization and crosslinking reactions are carried out at temperatures of about 130°-185° C., preferably about 150° to 160° C., for times of a few minutes to greater than one hour. The unexposed portions of the photopolymer compositions are preferably removed by solvent washout using such solvents as hot methanol, ethanol, or cold alcohol/chloroform mixtures. However, in general, the solvent used for coating can also be used for washout. After development, there results a negative image, i.e., polymer remains under the transparent areas of the process transparency, that is, the areas struck by radiation passing through the transparency.

EMBODIMENTS OF THE INVENTION

The following are illustrative examples of the invention in which all parts and percentages are by weight and all degrees are Celsius unless otherwise stated.

EXAMPLE 1

Anionic polymerization of Formaldehyde with Lithium o-Nitrobenzoxide Initiator

A resin kettle polymerization reactor was fitted with a gas inlet tube, a T tube attached to a bubbler and a dry argon source, and a vibromixer stirrer. The apparatus was flame-dried and cooled under a constant flow of dry argon. Into this reactor was placed 250 ml of freshly distilled tetrahydrofuran (THF), previously dried over sodium, and 1.52 g (0.010 mole) of a recrystallized o- nitrobenzyl alcohol. To this mixture was then added 2.5 ml of 1.6 molar (0.004 mole) n-butyllithium in hexane to form an equivalent amount of lithium o-nitrobenzoxide. The excess o-nitrobenzyl alcohol was present to serve as a chain transfer agent. In a second flame-dried resin kettle formaldehyde generator was placed 200 ml of decahydronaphthalene, 50 g of paraformaldehyde and 5 g of succinic anhydride. Succinic anhydride served as a scavenger for water to prevent its passage into the reactor where it could function as a chain-transfer agent. This generator was attached to the reactor via two traps which were cooled to −10° by ice-methanol baths. A stream of argon carrier gas was passed through the generator solution. The generator was then heated to 125°–150° (oil bath temperature set at 180°) and the formaldehyde passed through the traps into the reactor via the gas inlet tube which was inserted below the THF surface. White crystalline polymer formed continuously during the reaction period of approximately one hour. Completion of the reaction was indicated by a clearing of the decahydronaphthalene solution and the continued increase to the generator pot temperature to about 150°. The reaction was terminated by the addition of 5 ml of acetic acid, and the intermediate insoluble crystalline polymer was collected by filtration, washed with THF, refiltered and air dried.

The above intermediate polymer was stabilized by capping the terminal hydroxyl ends by reaction with acetic anhydride in the following way. The polymer was placed in a round-bottomed flask fitted with a reflux, condenser, thermometer and magnetic stirrer. To the flask was added 100 ml of acetic anhydride and 1.0 g of anhydrous sodium acetate. The mixture was heated rapidly to reflux at 140° and held at this temperature for 45 minutes. The polyoxymethylene polymer dissolved in the refluxing acetic anhydride. On cooling to room temperature, polymer precipitated as a very finely divided powder. The polymer was recovered by filtration, washed extensively with methanol, refiltered, and vacuum dried to give an overall yield based on paraformaldehyde of 14% (7.16 g). The onset of major melting of the polymer was 137°–140°, and the calculated average degree of polymerization (DP) of the polymer chains was approximately 25. An infrared spectrum indicated that nitro groups had been incorporated into the polymer with about 65% of the chains initiated by o-nitrobenzoxy groups.

A sample of the polymer was irradiated in a Pyrex® test tube by rolling the tube under a 275 watt sunlamp at a distance of 12 inches for periods of 30 minutes and 60 minutes. These samples were compared by DTA analysis to both unirradiated samples and unstabilized samples. The unirradiated reference polymer started melting about 140° with the maximum rate at 153°. No polymer weight loss occurred through three heat-cooling cycles through the melting point to 175°. The unstabilized (uncapped) polymer totally degraded on the first heading with the degradation onset occurring at 95°–119°, similar to the result obtained for uncapped paraformaldehyde. The irradiated samples showed degradation and weight loss occurring starting at 98°–119° with some melting of unactivated polymer at 140° to 153°. Subsequent heating cycles showed melting of still unactivated polymer at 140° to 153° C.

EXAMPLE 2

Anionic Polymerization of Formaldehyde with Lithium o-Nitrobenzoxide Initiator

The polymerization described in Example 1 was scaled up as follows. The formaldehyde generator was charged with 200 g of paraformaldehyde, 400 ml of decahydronaphthalene and 40 g of succinic anhydride. The polymerization reactor was charged with 500 ml of freshly distilled THF and 5.1 g (0.033 mole) of o-nitrobenzyl alcohol. This reactor was cooled to −30 to −50° with an ice-methanol-dry ice cold bath. To the reactor was then added 10 ml (0.016 mole) 1.6 N n-butyllithium in hexane. The generator was heated to 150° during which time a constant stream of argon carrier gas was passed through the mixture transporting the formaldehyde through the cold traps and into the reactor. Insoluble polymer started forming immediately and continued to do so until all of the paraformaldehyde had been decomposed. The reaction was terminated by adding 10 ml of acetic acid, and the product was filtered, washed with additional THF, and refiltered.

The above intermediate polymer was encapped as described in Example 1 with 500 ml of acetic anhydride and 1.0 g of anhydrous sodium acetate at 140° for 30 minutes. The capped polymer was washed and dried, as described, and a yield of 65 g (33%) of polymer was obtained. Infrared analysis showed that 68% of the polymer chains were initiated with an o-nitrobenzoxy group. The onset of major melting of the polymer was 140°, and the calculated average DP was about 30.

A sample of the polymer was irradiated for one hour as described in Example 1. DTA analysis of the irradiated sample indicated onset of degradation at 100° resulting in approximately 50% weight loss and considerable discoloration of the sample, apparently caused by reaction products derived from liberated o-nitroso-containing end groups. An unirradiated polymer sample showed no degradation upon heating and cooling for three cycles from 25°–175°, and no discoloration of the sample occurred.

CONTROL EXAMPLE A

Anionic Polymerization of Formaldehyde with p-Nitrobenzoxide as Initiator

This experiment demonstrated that a polyoxymethylene polymer capped with a p-nitrobenzoxy end group did not undergo photodecomposition.

The polymerization was carried out using the reactants and procedure described in Example 2 with the exception that o-nitrobenzyl alcohol was replaced with 5.1 g of p-nitrobenzyl alcohol. From 200 g of paraformaldehyde, the yield of acetate-capped polymer was 28.5 g (14%). Infrared analysis showed that 70% of the polymer chains were capped with p-nitrobenzoxy groups. The molecular weight, calculated from the observed melting point onset of 152°, corresponded to a DP∼33.

A sample of the polymer was irradiated for 1.5 hours as described in Example 1. DTA analysis of the irradiated polymer was identical with that of an unirradiated control sample; no degradation was observed through three heat-cool cycles to 180°.

EXAMPLE 3

Anionic Polymerization of Formaldehyde with Sodium o-Nitrobenzoxide as Initiator The polymerization was carried out using the reactants and procedure described in Example 2 with the exception that the n-butyllithium solution was replaced with 0.8 g of a 50% dispersion of sodium hydride in mineral oil (0.016 mole sodium hydride). When reaction between the sodium hydride and o-nitrobenzyl alcohol was complete (hydrogen evolution ceased), formaldehyde was generated and passed into the reactor in the usual way. The yield of product, after endcapping with acetic anhydride, amounted to 28.38 g (14%). Infrared analysis showed that essentially all of the polymer chains were capped with o-nitrobenzoxy groups, and melting point data showed a DP of approximately 30; onset of major melting, 140°.

A sample of powdered polymer was irradiated for 1 hour with a 275 w sunlamp placed 12 inches from an open dish which contained the polymer sample. Total degradation (indicated by DTA analysis) of this sample occurred; degradation endotherm ~98°. An unirradiated reference sample did not show any degradation upon three heat-cool cycles to 180°.

EXAMPLE 4

Anionic Polymerization of Formaldehyde with Lithium (TMEDA)$_2$ o-Nitrobenzoxide Initiator The polymerization was carried out using the procedure described in Example 2. The polymerization reactor was charged with 500 ml of freshly distilled sodium-dried cyclohexane and 5.0 grams of o-nitrobenzyl alcohol. To this mixture was added 0.4 ml (0.0033 mole) of freshly distilled N,N,N',N'-tetramethylethylenediamine (TMEDA) followed by 10 ml of 1.6 N butyllithium in hexane. The reaction mixture was cooled with an ice-water bath but not sufficiently to freeze the cyclohexane. Formaldehyde was then passed into the reactor in the usual way (200 g of paraformaldehyde was employed in the formaldehyde generator). The reaction was terminated by the addition of 20 ml of acetic acid when the paraformaldehyde was completely decomposed, and the polymer was separated by filtration. The polymer was endcapped as described in Example 2 to give 57 g of capped polymer (28.5% yield). The onset of the polymer melting point was 139°-140° corresponding to a DP of about 30. Infrared analysis showed that 79% of the polymer chains were capped with o-nitrobenzoxy groups.

A sample of the powdered polymer was irradiated as described in Example 3. Thermal decomposition of the irradiated polymer (DTA) occurred at 96° whereas nonirradiated polymer was stable through three heat-cool cycles to 175°.

EXAMPLE 5

Anionic Polymerization of Formaldehyde with Tetrabutylammonium o-Nitrobenzoxide as Initiator The polymerization was carried out using the procedure and apparatus described in Example 2. The polymerization reactor was charged with 500 ml of hexane, 5.0 g of o-nitrobenzyl alcohol and 10 ml (0.016 mole) of 1.6 N n-butyllithium in hexane. When the initial reaction had stopped, 4.43 g (0.016 mole) of tetrabutylammonium chloride was added. Formaldehyde was passed into the reactor in the usual way (200 g of paraformaldehyde was employed in the formaldehyde generator), and the polymerization reactor was maintained at about 25° by cooling with ice water. When the paraformaldehyde was comply decomposed, polymerization was terminated by the addition of 25 ml of an acetic acid-acetone mixture. The resulting polymer was separated by filtration, dried (34.2 g) and endcapped with acetic anhydride (400 ml) as described in Example 2 to give 25.8 g (12.9% yield) of capped polymer. Infrared analysis showed that 64% of the polymer chains were capped with o-nitrobenzoxy groups; DTA melting range = 137°-140° corresponding to a DP of 28-30.

A sample of the powdered polymer was irradiated as described in Example 3. Thermal decomposition of the irradiated polymer (DTA) occurred at 100° whereas nonirradiated polymer was stable through three heat-cool cycles to 175°.

EXAMPLE 6

Anionic Polymerization of n-Butyraldehyde with Lithium(TMEDA)$_2$ o-Nitrobenzoxide as Initiator A resin kettle polymerization reactor was fitted with an inlet port, a T tube attached to a bubbler and a source of dry argon, and a vibromixer stirrer. The apparatus was flame-dried and cooled under a constant flow of dry argon. About 200 ml of 30°-60° petroleum ether (previously dried over sodium) was distilled into the reactor and 100 ml of freshly distilled n-butyraldehyde was added.

The initiator solution was prepared in a separate dry, nitrogen-filled bottle. It consisted of 50 ml of THF (dried over sodium), 3.0 g of o-nitrobenzyl alcohol and 10 ml of 1.6 N n-butyllithium in hexane. The butyllithium solution was added slowly while the bottle was vented with nitrogen. After the reaction was completed, 2.0 ml of TMEDA was added to assist in solubilizing the initiator in the polymerization reaction medium. The initiator solution was added all at once to the polymerization reaction kettle, cooled to −78°. The reaction mixture gradually became more opaque and viscous. After 3 hours polymerization was terminated by the addition of a solution of 15 ml of acetic acid in 100 ml of ethanol while the temperature was maintained at < −40°. The crude polymer was separated by filtration, washed with ethanol, and dried. It was endcapped by reaction with a solution of 200 ml of acetic anhydride and 60 ml of pyridine at reflux temperature for 0.5 hour. The solution was cooled and the precipitated polymer was separated, washed with acetone, and dried to give 7.04 g (8.6% yield) of acetate-capped poly-n-butyraldehyde. Infrared analysis showed that essentially all of the polymer chains were capped with o-nitrobenzoxy groups.

A sample of the polymer was irradiated for 0.5 hour with a 275 w sunlamp placed 12 inches from an open dish which contained the polymer sample. Irradiation resulted in formation of color in the sample and a slight shift in the infrared absorption band of the nitro group. Thermal depolymerization of the irradiated polymer (DTA) occurred with evolution of butyraldehyde starting at 77°. The unirradiated sample was stable to 200° with no evidence of melting or decomposition.

EXAMPLE 7

Anionic Polymerization of Formaldehyde with the Lithium Alkoxide of Benzoin as Initiator The polymerization was carried out using the procedure and apparatus described in Example 2. The polymerization reactor was charged with 250 ml of freshly distilled THF (sodium dried) and 2.2 g of benzoin. The formaldehyde generator was charged with 50 g of paraformaldehyde and 200 ml of decahydronaphthalene. The generator was heated to 150°, and when the evolution of formaldehyde began, 2.5 ml of 1.6 N n-butyllithium in hexane was added to the cooled (−30° to −50°) polymerization reactor. The reaction mixture initially turned yellow and then faded to almost white as the insoluble polyformaldehyde formed. When all of the paraformaldehyde had been decomposed, 5.0 ml of acetic acid was added to the reactor to terminate the reaction. The polymer was isolated by filtration, washed with additional THF, filtered, and air dried (21.8 g; 43.6% yield). It was endcapped as described in Example 2 (200 ml of acetic anhydride). Infrared analysis of the acetate-capped polymer showed the presence of both acetate (5.78μ) and benzoyl carbonyl (5.9μ) absorption bands. Comparison of the ratio of these two bonds with a reference benzoin ether/amyl acetate mixture indicated 57% of the chains were capped with benzoin ether units. DTA melting point data for unirradiated polymer indicated a double break at 109° (DP=19) and 137° (DP ~30).

Samples of the benzoin-containing polymer and the polymers of Example 1 were irradiated in open aluminum pans at a distance of 25 inches from the sunlamp for 1.5 hours. Samples were removed at 15-minute intervals, weighed, and analyzed by DTA. Thermal degradation of the irradiated samples occurred compared with the unirradiated controls. However, the rate of weight loss for the o-nitrobenzyl-capped polymer was approximately 11 times that of the benzoin-capped polymer.

When a sample of the benzoin-capped polymer was irradiated in a test tube under an argon atmosphere for 1.5 hours by the procedure of Example 1, it did not show significant thermal degradation compared with an unirradiated control sample.

EXAMPLE 8

Anionic Polymerization of Formaldehyde with Lithium o-Nitrobenzoxide Initiator The procedure and reactants used were those of Example 1 with the following modifications. The polymerization reactor was cooled at −30° during the polymerization, and the butyllithium solution was added at the onset of formaldehyde generation. The reaction was terminated by the addition of acetic acid when the inlet tube became plugged with polymer.

The crude polymer (14.45 g) was endcapped by reaction with 100 ml of acetic anhydride and 25 ml of pyridine at 125°. The recovered, dried polymer weighed 10.96 g. Infrared analysis showed that the majority of the polymer chains were endcapped with o-nitrobenzoxy groups; DTA melting point=141° corresponding to an average DP ~30.

Irradiation of the polymer as described in Example 1, showed photosensitivity resulting in polymer degradation upon heating (DTA analysis) after 30 minutes and 60 minutes exposure times.

EXAMPLE 9

Endcapping of Polyformaldehyde with o-Nitrobenzyl Groups

A 500 ml 3-necked flask was equipped with a mechanical stirrer, thermometer and nitrogen bubbler. Fifty grams of uncapped polyoxymethylene polymer of molecular weight ~130,000 was added, the nitrogen bubbler was replaced with a vacuum line, and the polymer was dried at 160°, 0.5 mm pressure, for 60 minutes with stirring. Nitrogen was added, the flask was cooled to 40°–50°, and 150 ml of heptane, dried by distillation from calcium hydride, and 4.8 g of tris(o-nitrobenzyl) orthoformate were added. The reaction mixture was heated with stirring at 73° for 15 minutes, 0.2 ml of boron trifluoride etherate was added, and the reaction mixture was stirred at 73°–75° for one hour. It was cooled to room temperature, 5 ml of tributylamine was added, and the mixture was stirred for 15 minutes. The capped polymer was separated by filtration, washed successively with methanol and with acetone, and finally dried at 60° (0.2 mm), yield 40.08 g, mp (capillary tube), 157°–160°.

A film of this polymer, first cold pressed and then pressed at 170°, was exposed to radiation from a mercury resonance lamp for 10 minutes through a process transparency. The exposed film was thermally developed by heating it in a circulating air oven at 160° for 0.5 hr. Imaging was observed, although some degradation of the unexposed areas of the film was noted.

To improve its thermal and base stability, a 5.0 g sample of the polymer was post-treated by suspension in a mixture of 30 ml of benzyl alcohol and 1.5 ml of tributylamine followed by a 30-minute nitrogen purge. The polymer was dissolved by heating the suspension in an oil bath preheated to 165°, and the solution was further heated at ~140° for one hour followed by cooling under nitrogen. The precipitated polymer was washed with acetone and dried, yield 0.99 g (20% recovery). Ultraviolet absorption analysis in hexafluoroisopropanol solvent showed the presence of 156 formaldehyde units/o-nitrobenzyl chromophoric group. The ultraviolet absorption band at 267 nm was employed for this analysis, and a molar extinction coefficient, $\epsilon = 4500$, was used as a reference for o-nitrobenzyl groups, obtained from the value for o-nitrophenylethylene glycol.

The experiment was repeated as described, and the polymer recovery after treatment with benzyl alcohol-tributylamine was 0.64 g (12.8%), mp 156°–158°. A film of this polymer was exposed to radiation, as described, to give an image with good relief. In these instances a positive image was obtained, i.e., polymer remained under the opaque areas of the process transparency, that is the areas not struck by radiation passing through the transparency.

EXAMPLE 10

This example demonstrates the superior photothermal decomposition properties of the polymers of this invention compared with the intercalated polymers of the common assignee's U.S. Pat. No. 3,991,033.

TEST PROCEDURE A

Samples of each polymer were melt-pressed into thin films on weighed aluminum plates, each sample having an oriented polyester coversheet. The coversheets were removed and the weight of each sample determined. The samples were then exposed simultaneously to a 275 w sunlamp placed two feet from the plates for a period of one hour. The positions of the plates were rotated every 15 minutes so that each sample was in each location for an identical period of time. Following exposure each plate was again weighed and weight loss accompanying exposure determined. It was found that no sample changed significantly during exposure. The samples were then heated on a regulated hot plate at 180° for 10 minutes. The appearance of each sample was recorded and the weight loss determined.

TEST PROCEDURE B

Samples were melt pressed onto preweighed aluminum sheets. After obtaining their weights, the samples were in turn heated with melting at 180° C. for 10 minutes on a regulated hot plate. They were then cooled and their weight loss determined. No significant loss occurred for any sample. The samples were again heated to 180° C. and the molten polymers were irradiated with a 250 w sunlamp set at a distance of eight inches for 15 minutes. Finally the samples were removed, cooled to room temperature and physical appearance and weight loss were measured.

The results from these experiments are summarized in Table I.

The intercalated polyoxymethylene control polymer was prepared as follows. Uncapped polyoxymethylene product was cooled, filtered, and washed thoroughly with methanol and acetone. The weight of dried, light sensitive, intercalated polymer, obtained as a colorless or very pale yellow solid, was 99.6 g.

To improve its thermal and base stability, the polymer was post-treated by suspension in 600 ml of benzyl alcohol and 30 ml of tributylamine followed by a 2.2 hour nitrogen purge. The polymer was dissolved by heating the suspension to 160° over a period of 25–30 minutes, and the clear yellow solution was further heated at 160° for 15 minutes followed by rapid cooling with an ice bath. The swelled and voluminous reprecipitated polymer was filtered, washed extensively with methanol and acetone, and dried in vacuo at 70°. The weight of purified polymer was 45.5 g. The purified polymer was combined with that obtained from two similar intercalation experiments (116.2 g total), and the mixture retreated with 600 ml of benzyl alcohol and 30 ml of tributylamine as described. The dried product amounted to 115.1 g (>99% recovery), $\eta$ inh=0.63 (30°, 0.5% in hexafluoroisopropanol (HFIP), MW ~15,000). Ultraviolet analysis (HFIP) showed the presence of 178–128 formaldehyde units/oxyethylene unit.

The concentration of oxyethylene groups was determined by ultraviolet spectroscopy using the molar extinction coefficient of the aromatic substituent which was obtained from the 4-o-nitrophenyl-1,3-dioxolane starting material. A band at 267 nm was employed having an extinction coefficient $\epsilon$=4,500.

Table I

| | | | | Relative | |
|---|---|---|---|---|---|
| Sample No. | Sample | Test Procedure | Corrected % of wt. Loss* | Reaction Rate | Remarks |
| 1 | Example 3 | A | 36 | 1.91 | Discolored on irradiation; deep amber-brown residue after heating; evolution of formaldehyde gas |
| 2 | Example 2 | A | 36.8 | 1.96 | Same as Sample 1 |
| 3 | Example 4 | A | 25.2 | 1.34 | Same as Sample 1 |
| 4 | Control Polymer | A | 18.8 | 1 | Less discolored than Samples 1, 2, 3 after exposure; fractured, brittle, discolored polymer after heating |
| 5 | Example 3 | B | 70 | 1.37 | Light beige melt on heating; dark oil formed during irradiation accompanying evolution of formaldehyde gas; deeply discolored residue after exposure |
| 6 | Example 2 | B | 79 | 1.54 | Same as Sample 5 |
| 7 | Control Polymer | B | 51 | 1 | Light beige melt on heating; some darkness on exposure with evolution of formaldehyde; brittle polymeric residue after exposure. |

*Corrected weight loss = % weight loss of volatile component of polymer (110.08 g MW ~60,000) was dried in vacuo in a 500 ml 2-necked flask at 60°–120° for 4.5 hours. The center neck had a stopcock adaptor to a vacuum pump, and the side arm was fitted with a serum cap. The weight of dried polymer was 100.49 g (8.7% loss). A nitrogen bubbler was substituted for the vacuum pump and 240 ml of heptane (freshly distilled from calcium hydride) and 30 ml of freshly distilled 4-o-nitrophenyl-1,3-dioxolane were added via syringe through the serum cap under nitrogen. The nitrogen bubbler valve was closed, and the reaction mixture was immersed in a preheated 75° bath for 40 minutes with stirring. After the addition of 0.05 ml of freshly distilled $BF_3 \cdot (C_2H_5)_2O$ the slurry was maintained at 70°–80° for one hour. The reaction was quenched with 10 ml of tributylamine, and the

EXAMPLE 11

This example demonstrates the utility of photothermosensitive polyaldehydes as a source of aldehyde, useful for crosslinking polyamides, which have photoimaging, adehsive, and coating applications.

A. A mixture of 5.0 g of Elvamide ® Nylon Resin (8023), 1.0 g of the polyoxymethylene of Example 8 and 50 ml of methanol was heated to 60° with stirring to dissolve the polyamide resin, and this dispersion was sprayed onto a shiny aluminum panel. The panel was cooled and dried. It was exposed for 5 minutes in a vacuum frame through a process transparency. The radiation source was a 275 watt sunlamp mounted 10 inches from the coated panel. After exposure the panel was developed thermally by heating at 150° for 15 minutes in a circulating air oven. A good image with good relief was obtained in the radiation-struck areas after removal of the uncrosslinked nylon resin with warm methanol. Some large polyoxymethylene particles which were poorly dispersed were visible.

B. Example 11-A was repeated with Elvamide® 8061 Nylon Resin replacing the 8023 resin. Imaging was again obtained, but relatively poor adhesion to the aluminum plate was noted in the absence of a conventional adhesion promoter.

C. A mixture was prepared by dissolving 2.5 g Elvamide® 8061 Nylon Resin and 0.5 g Ciba® 825 polyaminepolyamide resin in 25 ml of methanol. In a second container 1.0 g of the polyoxymethylene of Example 8 was finely dispersed in 25 ml of butanol. The two mixtures were combined and then heated to drive off the methanol leaving all polymeric materials suspended in the residual butanol. This mixture was then sprayed onto shiny aluminum panels and allowed to dry.

Samples were irradiated as described in Example 11-A above for 5 minutes and then thermally treated in a circulating air oven at 150° for periods of 1, 2, 3, 4, 5, 7, and 10 minutes. The images were finally developed by washing with warm methanol. Adhesion of imaged material to the substrate was excellent. Good relief images were obtained for all samples heated for 1-7 minutes. Some background developed for samples heated for 7 and 10 minutes.

What is claimed:

1. An imagable article comprising a substrate having on its surface a film of a composition comprising a blend of a photosensitive polyaldehyde having the formula:

$$RO \left[ \begin{array}{c} R^1 \\ | \\ C-O \\ | \\ H \end{array} \right]_n R^2$$

wherein

R is a photosensitive end group selected from (a) 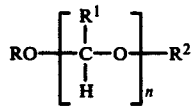 and (b) $C_6H_5\overset{O}{\overset{\|}{C}}HCC_6H_5$, $R^1$ is H or n-alkyl of 1-5 carbon atoms, $R^2$ is (a) n-alkanoyl of 1-4 carbon atoms or (b) n-alkanoyl of 1-4 carbon atoms or

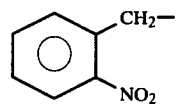

when $R^1$ is H, and n is a positive integer of 10–4000 with a polymer capable of being cross-linked with aldehyde thermally released from the polyaldehyde.

2. The article of claim 1 wherein the polymer is a polyamide.

3. The article of claim 2 wherein $R^1$ is H.

4. The article of claim 3 wherein R is $C_6H_5\overset{}{\underset{|}{C}}HCOC_6H_5.$ 5. The article of claim 4 wherein $R^2$ is acetyl and n is 15–300.

6. The article of claim 3 in which R is

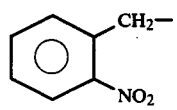

and the polyaldehyde is present in the blend at a concentration of 5-30 percent by weight.

7. The article of claim 6 wherein $R^2$ is acetyl and n is 15–300.

8. The article of claim 6 wherein the film on the surface of the substrate is 0.01-25 mils in thickness.

9. The article of claim 6 which is a lithographic printing plate.

10. A process for the formation of images comprising (1) imagewise exposing the article of claim 1 to radiation of wavelength in the range of 2,000 Å–8,000 Å for a time sufficient to effect substantial rearrangement of the photosensitive end groups of the polyaldehyde; (2) heating the exposed article at a temperature and for a time sufficient to effect cleavage of the rearranged end groups, to release aldehyde monomer from the polyaldehyde, and to effect crosslinking of the polymer with the released aldehyde and (3) removing non-crosslinked polymer from the areas not exposed to radiation.

11. The process of claim 10 wherein the article is the article of claim 6.

12. The process of claim 11 wherein the exposed article is heated to a temperature in the range of 130°–185° C.

13. The process of claim 12 wherein the wavelength of exposing radiation is in the range of 2,500 Å–5,000 Å and the non-crosslinked polymer is removed by solvent.

* * * * *